United States Patent
Jin et al.

(10) Patent No.: US 7,692,927 B2
(45) Date of Patent: Apr. 6, 2010

(54) SHIELDING AND HEAT DISSIPATION DEVICE

(75) Inventors: Linfang Jin, Shenzhen (CN); Liechun Zhou, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 12 days.

(21) Appl. No.: 12/249,541

(22) Filed: Oct. 10, 2008

(65) Prior Publication Data

US 2009/0040731 A1 Feb. 12, 2009

Related U.S. Application Data

(63) Continuation of application No. PCT/CN2008/070419, filed on Mar. 5, 2008.

(30) Foreign Application Priority Data

Apr. 4, 2007 (CN) .................... 2007 2 0143737 U

(51) Int. Cl.
*H05K 7/20* (2006.01)
(52) U.S. Cl. .................... 361/704; 361/719; 361/818; 257/712; 174/16.1; 165/80.3
(58) Field of Classification Search ............. 361/704, 361/719, 818; 165/80.3
See application file for complete search history.

(56) References Cited

U.S. PATENT DOCUMENTS

| | | | | |
|---|---|---|---|---|
| 5,241,453 A | * | 8/1993 | Bright et al. | 361/704 |
| 5,357,404 A | * | 10/1994 | Bright et al. | 361/818 |
| 6,229,702 B1 | * | 5/2001 | Tao et al. | 361/704 |
| 6,377,474 B1 | * | 4/2002 | Archambeault et al. | 361/818 |
| 6,507,101 B1 | * | 1/2003 | Morris | 257/706 |
| 6,577,504 B1 | * | 6/2003 | Lofland et al. | 361/709 |
| 6,697,263 B2 | * | 2/2004 | Szu | 361/816 |
| 6,744,640 B2 | * | 6/2004 | Reis et al. | 361/818 |
| 6,858,796 B1 | | 2/2005 | Garnett et al. | |
| 6,992,894 B1 | | 1/2006 | Mease et al. | |
| 7,053,295 B2 | * | 5/2006 | Murasawa | 174/377 |
| 7,245,896 B2 | * | 7/2007 | Seo et al. | 455/300 |
| 7,327,577 B2 | * | 2/2008 | Gilliland et al. | 361/719 |
| 2003/0161108 A1 | | 8/2003 | Bright et al. | |
| 2004/0052064 A1 | | 3/2004 | Oliver et al. | |
| 2004/0257786 A1 | | 12/2004 | Murasawa | |

FOREIGN PATENT DOCUMENTS

| | | |
|---|---|---|
| CN | 1606400 | 4/2005 |
| CN | 1802747 | 7/2006 |

\* cited by examiner

*Primary Examiner*—Boris L Chervinsky
(74) *Attorney, Agent, or Firm*—Darby & Darby

(57) ABSTRACT

Discloses herein is a shielding and heat dissipation device comprising a conductive bracket (1) provided on a PCB around a shielded heat-generating electronic component, and electrically connected to a conductive layer of the PCB; a heat sink (2), which is arranged above the heat-generating electronic component (3) and is provided with a conductive surface electrically connected to the conductive bracket (1). With the conductive surface, which may be used to replace a top cover of a prior art shielding case, developed on the bottom or sidefaces of the heat sink, an effective shielding cavity is formed by conductively connecting the conductive surface of the heat sink to the other parts of the shielding case. That is to say, the conductive surface of the heat sink serves as a part of the shielding case, so that the heat sink may play a role in electromagnetic shielding as well as in dissipating heat sufficiently.

8 Claims, 3 Drawing Sheets

SHIELDING AND HEAT DISSIPATION DEVICE

CROSS-REFERENCE TO RELATED APPLICATIONS

This application is a continuation of International Patent Application No. PCT/CN2008/070419, filed on Mar. 5, 2008, which claims the benefit of Chinese Patent Application No. 200720143737.4, filed Apr. 4, 2007, both of which are incorporated herein by reference in their entireties.

FIELD OF THE INVENTION

The present invention relates to the field of electronic technology, and particularly to a shielding and heat dissipation device.

BACKGROUND OF THE INVENTION

Application of new functions as well as new accessories in electronics field is becoming increasingly popular. Due to a development trend to higher processing power and broader application, heat generated by a device is also largely increased; meanwhile, integration level for parts keeps increasing, and the electronic device tends to get miniaturized. On one hand, the electronic device is becoming smaller; on the other hand, the power consumption of the electronic device is increasing. A direct result of this is an increasing heat flux density within the device, with a dramatic increase on cost as well as much more difficulty in heat dissipation, which forms a bottleneck during designing. Thus, under plural restrictive conditions in actual products, there exists an urgent need to solve the problem how to effectively dissipate heat generated by parts which are arranged on a circuit board in a high density.

SUMMARY OF THE INVENTION

Embodiments of the present invention provide a shielding and heat dissipation device, which can perform functions of both shielding and heat dissipation.

The shielding and heat dissipation device according to an embodiment of the present invention includes: a conductive bracket provided on a Printed Circuit Board (PCB) around a shielded heat-generating electronic component and electrically connected to a conductive layer of the PCB; and a heat sink arranged above the heat-generating electronic component and provided with a conductive surface electrically connected to the conductive bracket.

According to the technical solution provided by the embodiment of the present invention, sufficient contact is realized between the heat sink and the heat-generating electronic component so as to achieve a favorable heat dissipation effect. Meanwhile, the conductive surface of the heat sink, as a part of a shielding cavity, may form a complete shielding cavity with the conductive bracket and the conductive layer on the PCB. Therefore, a favorable shielding effect is achieved.

Figure 1:
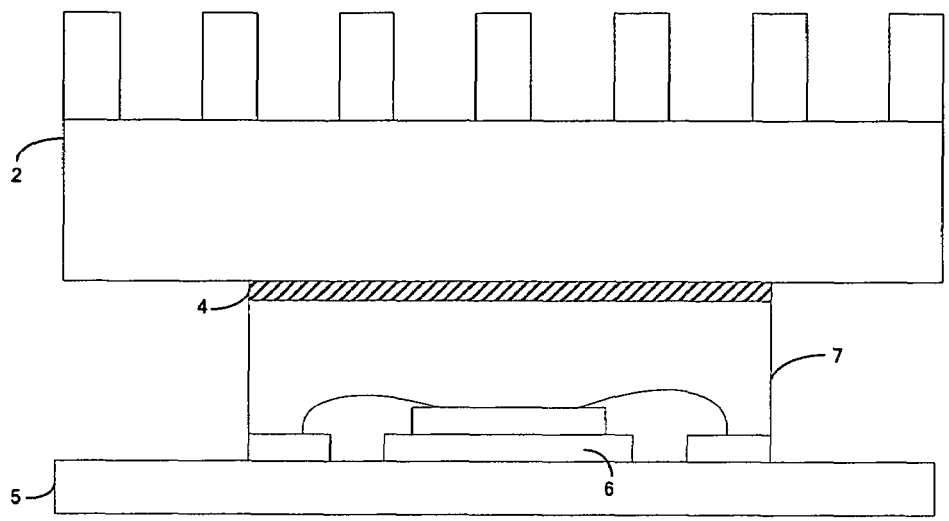
FIG. 1 illustrates an interior structural schematic view of prior art in which a heat sink is employed to dissipate heat.

REFERENCE NUMERALS 1 elastic sheetmetal
2 heat sink
3 heat-generating electronic component
4 heat transfer layer
5 PCB
6 hot weld plate
7 heat generating components
8 metal boss for heat sink
9 shielding case
10 screw
11 nut

DETAILED DESCRIPTION OF EMBODIMENTS

To this day, a number of ways are developed for dissipating heat generated in electronic components, and conventional heat dissipation ways include heat conduction, heat convection and heat radiation. A conventional solution for dissipating heat is to provide a heat sink above the components, as shown in FIG. 1. A heat transfer layer 4 is provided on a surface of a heat sink 2 and a surface of a heat generating component 7 so as to reduce interfacial thermal resistance between the heat sink 2 and the heat generating component 7. In the case that natural heat dissipation is adopted, surface treatment such as anodization is required for the surface of the heat sink. After surface treatment, owing to an improved surface heat dissipating capability, the heat sink is provided with an improved heat radiation capability, and is more resistant to corrosion. In this manner, heat generated by a component that generates a large amount of heat may be effectively dissipated, and the temperature of the component is lowered.

In many application areas, e.g. in a wireless terminal, electromagnetic shielding is required for both RF chip and baseband chip. According to a prior art shielding method, stainless steels or other sheetmetals are required to be welded on a Printed Circuit Board (PCB) around the component to be shielded, thus to form a complete cavity of conductive metals with a ground copper sheet of the PCB. The component may be located within the metal cavity. The metal cavity may be configured as a single cavity or a number of cavities based on shielding requirement. It is found out in research that the above method to dissipate heat by mounting a heat sink can not be employed to dissipate heat generated by a component located inside the shielding cavity, though heat generated by a component that generates a large amount of heat may be effectively dissipated and the temperature of the component may be lowered by such a method, because the heat sink may not directly contact the components due to the presence of a shielding case. If it is intended to mount a heat sink, thermal interface material has to be filled between the shielding case and the heat sink to reduce interfacial thermal resistance therebetween. Therefore, thermal interface material is required to be applied twice between the shielding case and the heat sink as well as between the shielding case and the heat generating component, resulting in a greater thermal resistance between the heat sink and the component, and the efficiency of the heat sink is greatly deteriorated.

In a case that a top cover of the shielding case is removed and thermal interface material is filled between the heat sink and the component, the shielding problem can not be solved and the electrical index is not acceptable. Because the surface of the heat sink that has been subjected to surface treatment is not conductive, a complete conductive shielding cavity with the other parts of the shielding cavity may be formed, thus tending to result in a serious problem with respect to Electro Magnetic Compatibility (EMC).

Besides, when a conductive heat sink is employed, it proves to be difficult to install a heat sink so that the heat sink forms a secure and close contact with the component and at the same time forms an electrical connection with the other parts of the shielding case. Meanwhile, the heat radiation capability of the heat sink is relatively low, and the heat sink is prone to be corroded.

In view of this, according to an embodiment of the present invention, a shielding and heat dissipation device is provided. As to the heat sink with a conductive surface, a conductive bracket is provided between the heat sink and a conductive layer of the PCB to form a connection there-between. The conductive bracket is arranged on the PCB around the shielded heat-generating electronic component and is electrically connected to the conductive layer of the PCB, so as to form a complete shielding cavity with the heat sink and the conductive layer of the PCB, so that the heat sink may play a role in the electromagnetic shielding of the electronic component. As to the heat sink with a non-conductive surface, a conductive surface which may be provided at the bottom or on the sidefaces of the heat sink is provided to the heat sink, and the conductive surface of the heat sink and the conductive layer of the PCB is connected with a conductive bracket to form a complete shielding cavity between the conductive bracket, the heat sink and the conductive layer of the PCB, so that the heat sink may perform a function of heat dissipation as well as a function of electromagnetic shielding. The above conductive bracket may be an elastic sheetmetal, or elastic conductive foam, etc., which plays a role in supporting as well as conductive shielding.

Embodiment 1

Figure 2:
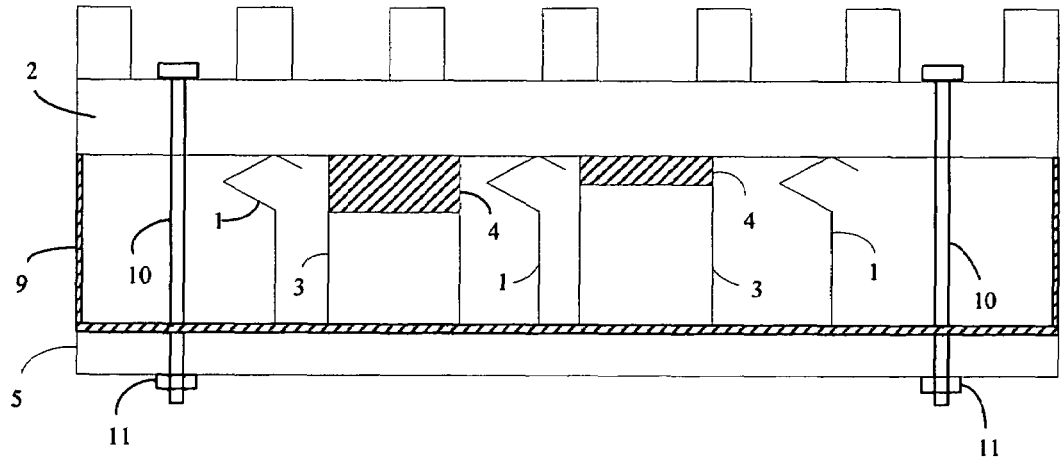
FIG. 2 illustrates an interior structural schematic view of a shielding and heat dissipation device according to a first embodiment of the present invention.

FIG. 2 illustrates an interior structure of a shielding and heat dissipation device according to an embodiment of the present invention. In this Figure, elastic sheetmetals 1 serves as a bracket, and, taking into consideration of structures for prior art shielding case, a shielding case 9 is designed to be open at the top. At the same time, the elastic sheetmetals 1 are integrally formed with the shielding case 9, so that the elastic sheetmetals 1, as a part of the shielding case 9, are provided within the cavity in the shielding case 9 and are arranged around the heat-generating electronic components 3. Same as the installation of the prior art shielding case, the shielding case 9 is welded to the PCB 5, and the bottom of the shielding case 9 is electrically connected to the conductive layer of the PCB 5. In the case that the surface of the heat sink 2 is conductive, the bottom of the heat sink 2 may be used as a conductive surface, while the other part of the heat sink 2 except the bottom thereof is anodized, so that the conductivity of the bottom is kept. Another possible solution is to anodize the heat sink 2 firstly, then to plate a conductive metal layer on the bottom of the heat sink 2, so that the bottom of the heat sink 2 may have a conductive characteristic. The anodization of the heat sink 2 is for improving the surface emissivity of the heat sink 2 and enhancing its heat dissipation capability. The anodized part of the heat sink 2 is non-conductive.

The conductive layer of the PCB 5 may be the ground copper sheet of the PCB 5. Owing to the intrinsic elasticity of the elastic sheetmetals 1, the heat sink 2 may be directly pushed against the elastic sheetmetals 1, so that the elastic sheetmetals 1, due to their elasticity, abut against the bottom of the heat sink 2. Thus, the elastic sheetmetals 1 may be electrically connected to the bottom of the heat sink 2 in an easy manner. By this, the bottom of the heat sink 2 serves as a top of the shielding case 9 so as to form a complete shielding cavity together with the shielding case 9. At the same time, elastic sheetmetals 1 arranged in the shielding case 9 around the heat-generating electronic components 3 may divide the large shielding cavity, which is formed by the heat sink 2 and the shielding case 9, into a number of small shielding cavities so as to shield electromagnetic radiation produced by respective heat-generating electronic components 3.

However, pushing the heat sink 2 against the elastic sheetmetals 1 solely by its own weight may result in a loose physical connection between the heat sink 2 and the elastic sheetmetals 1, and the heat sink 2 may not be stably secured, either. To solve this problem, locating holes may be respectively provided at corresponding positions of the heat sink 2 and the PCB 5. When the heat sink 2 is pushed against the elastic sheetmetals 1 and the locating holes of the heat sink 2 and the PCB 5 are respectively aligned, screws 10 may be inserted into the locating holes of the heat sink 2 and the PCB 5. Nuts 11 are screwed and tightened onto another end of the screws 10 to provide a certain pretension force, so that the elastic sheetmetals 1 may sufficiently contact the bottom of the heat sink 2. In this way, the heat sink 2 may be securely fastened to the PCB 5.

Besides the screws and nuts which may be used for fastening the heat sink 2 as described above, there exist a lot of other means for fastening the heat sink 2. A usual way is to, for example, provide a number of clip holders on the PCB 5 to hold the heat sink 2 onto the PCB 5 by clip springs, and the details thereof will not be discussed further hereinafter.

Meanwhile, heat transfer layers 4 may be filled into tiny air gaps between the heat sink 2 and the heat-generating electronic components 3. The heat transfer layers 4 are made up of thermal interface material, e.g. thermal conductive pad or thermal conductive adhesive, to reduce the interfacial thermal resistance between the heat sink 2 and the heat generating components 3, so as to make a better use of the heat dissipation capability of the heat sink 2. For heat-generating electronic components 3 with different heights, the heat transfer layers 4 may have different thickness, or be compressible thermal interface material with the same thickness. Part of the heat generated by the heat-generating electronic components 3 is conducted to the heat sink 2 via the heat transfer layers 4, and the heat sink 2 then dissipates the heat into surroundings through thermal radiation and air convection. In this way, heat generated by the heat-generating electronic components 3 is eventually dissipated into surroundings, and the temperature of the heat-generating electronic components 3 drops.

According to the first embodiment of the present invention, only one layer of heat transfer layer 4 is required to be filled between the heat sink 2 and the heat-generating electronic components 3, while in the prior art, heat transfer layers 4 are required to be applied between the shielding case and the heat sink as well as between the shielding case and the heat-generating electronic components, respectively. By comparison, better heat dissipation effect may be realized by the present invention.

Embodiment 2

Figure 3:
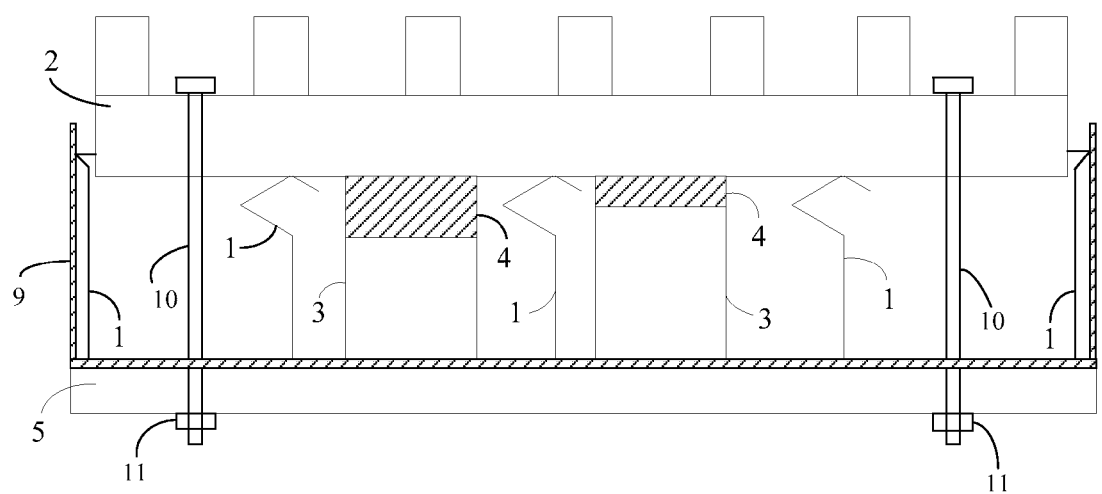
FIG. 3 illustrates an interior structural schematic view of a shielding and heat dissipation device according to a second embodiment of the present invention.

According to one embodiment shown in FIG. 3, the elastic sheetmetals 1 in the shielding case 9 are electrically connected to the bottom of the heat sink 2. For a better electromagnetic shielding effect, the second embodiment of the present invention, based on that shown in FIG. 2, also arrange the sidefaces of the heat sink 2 as conductive surfaces. In other words, both the bottom and the sidefaces of the heat sink 2 are conductive surfaces. As shown in FIG. 3, the elastic sheetmetals 1 are electrically connected to the sidefaces of the heat sink 2. The elastic sheetmetals 1 are integrally formed with the shielding case 9. The shielding case 9 is welded on the PCB 5 and is electrically connected to the conductive layer of the PCB 5. Elastic sheetmetals 1 that are electrically connected to the sidefaces of the heat sink 2 are required to be provided, based on the size of the heat sink 2, at corresponding positions of the shielding case 9, so that when the heat sink 2 is inserted into the top opening of the shielding case 9 and is pushed downwardly, the heat sink 2 may be urged inwardly by the elasticity of the elastic sheetmetals 1 that are electrically connected to the sidefaces of the heat sink 2. However, the heat sink 2 may not be stably secured solely by the elastic force of the elastic sheetmetals 1. To solve this problem, locating holes may be respectively provided at corresponding positions of the heat sink 2 and the PCB 5. When the heat sink 2 is electrically connected to the elastic sheetmetals 1 and the locating holes of the heat sink 2 and the PCB 5 are respectively aligned, screws 10 are inserted into the locating holes of the heat sink 2 and the PCB 5. Nuts 11 are screwed and tightened onto another end of the screws 10 to provide a pretension force, so that the elastic sheetmetals 1 may sufficiently contact the bottom of the heat sink 2. In this way, the heat sink 2 may be securely fastened to the PCB 5. Meanwhile, the top of the heat sink 2 may be subjected to an anodization to improve the surface thermal radiation capability of the heat sink 2, thus to improve the heat dissipation capability thereof.

Embodiment 3

Figure 4:
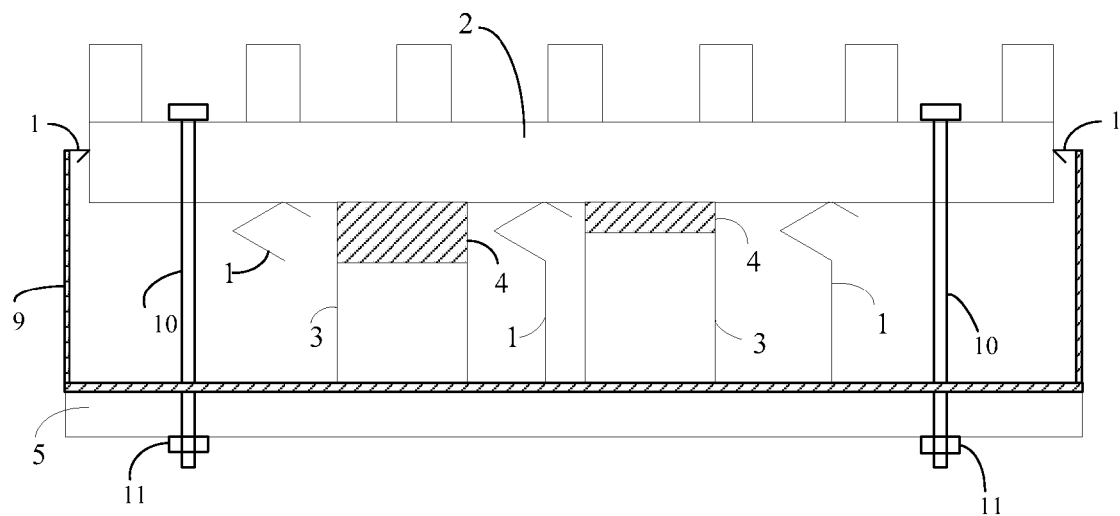
FIG. 4 illustrates an interior structural schematic view of a shielding and heat dissipation device according to a third embodiment of the present invention.

The elastic sheetmetals 1 that are electrically connected to the sidefaces of the heat sink 2 in the embodiment 2 as shown in FIG. 3 are modified. As shown in FIG. 4, the elastic sheetmetals 1 are provided on side walls of the shielding case 9, and the elastic sheetmetals 1 are also integrally formed with the shielding case 9. When the heat sink 2 is inserted into the top opening of the shielding case 9 and is pushed downwardly, the elastic sheetmetals 1 on side walls of the shielding case 9 are urged outwardly and are forcedly deformed. Owing to their elasticity, the elastic sheetmetals 1 will apply an inwardly urging force onto the heat sink 2 and urge the heat sink 2 inwardly by this urging force, so that a favorable electrical connection may be developed between the elastic sheetmetals 1 and the sidefaces of the heat sink 2. However, the heat sink 2 may not be stably secured solely by the urging force of the elastic sheetmetals 1. Therefore, same fastening means as the bolts or clipping springs disclosed in the above embodiments 1, 2 may be employed to fasten the heat sink 2 onto the PCB 5.

Elastic sheetmetals are employed in the above embodiments to serve as brackets. Of course, besides elastic sheetmetals, a lot of alternatives may be utilized to realize the same object of the embodiments of the invention. For example, the elastic sheetmetals may be replaced by elastic conductive foams. By their elasticity, the conductive foams may connect the conductive surfaces of the PCB with that of the heat sink to realize a favorable conduction therebetween, as well as to form a framework for the electromagnetic shielding cavity.

Embodiment 4

Figure 5:
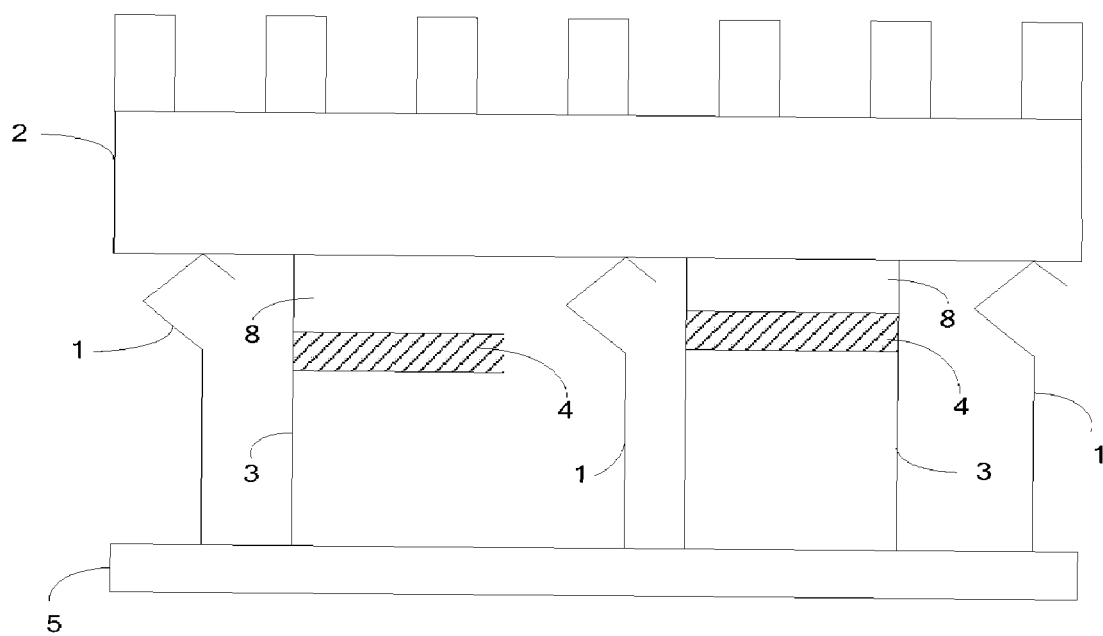
FIG. 5 illustrates an interior structural schematic view of a shielding and heat dissipation device according to a fourth embodiment of the present invention.

To reduce the thermal resistance between the heat-generating electronic components 3 and the heat sink 2, the lower surface of the heat sink 2 may be formed as metal bosses. As shown in FIG. 5, which illustrates an interior structural schematic view according to a fourth embodiment of the present invention, because heights of respective heat-generating electronic components 3 are different from each other, gaps between those electronic components with a smaller height and the heat sink 2 are relatively larger, thus resulting in a relatively large thickness of the heat transfer layers 4 filled in the gaps and thereby a deteriorated heat dissipation effect. To solve this problem, metal bosses 8 for heat sink may be provided on the lower surface of the heat sink 2. The heights of the metal bosses 8 for heat sink may be respectively adjusted as necessary based on the different heights of the heat-generating electronic components 3. The purpose of this adjustment is to reduce the gaps between the heat sink 2 and the heat-generating electronic components 3, thus to reduce the thickness of the heat transfer layers 4 filled in the gaps, thereby achieving a better heat dissipation effect.

The fourth embodiment of the present invention is modified on the basis of the above embodiments. A special structural design is developed for the heat sink 2, so that the thickness of the heat transfer layers 4 filled between the heat sink 2 and the heat-generating electronic components 3 may be reduced, thus resulting in a better heat dissipation effect.

Due to the special internal structure design of the heat sink, the embodiments of the present invention appropriately provides a heat sink with a dual function of heat dissipation as well as electromagnetic shielding without changing a prior art heat dissipation construction for electronic components. Meanwhile, the internal structure of the heat sink is simple, and the installation is trouble avoided.

Disclosed above are merely several specific embodiments of the present invention. However, the present invention is not limited thereto. For those skilled in the art, various variations and modifications which are made without departing from the spirit of the invention shall fall within the scope of the invention.

What is claimed is:

1. A shielding and heat dissipation device comprising:
   a conductive bracket (1) provided on a Printed Circuit Board (PCB) around a shielded heat-generating electronic component arid electrically connected to a conductive layer of the PCB; and
   a heat sink (2) arranged above the heat-generating electronic component (3) and provided with a conductive surface electrically connected to the conductive bracket (1),
   a shielding case (9), wherein a bottom of the shielding case (9) is electrically connected to the conductive layer of the PCB, the conductive surface of the heat sink serves as a top of shielding case (9) so as to form a complete shielding cavity with said shielding case (9), and the conductive bracket is arranged within the shielding cavity in the shielding case and is connected to the shielding case.

2. The shielding and heat dissipation device according to claim 1, wherein the conductive surface of the heat sink (2) is obtained by keeping conductive characteristic of one surface of the heat sink (2) whose surfaces are conductive, while the other parts of the heat sink (2) are subjected to an anodization; or by performing an anodization on the surfaces of the heat sink (2), and then plating a conductive metal layer on the surface of the heat sink (2) that needs to be conductive.

3. The shielding and heat dissipation device according to claim 1, wherein locating holes is respectively provided at corresponding positions of the heat sink (2) and the PCB, by which the heat sink (2) may be fastened onto the PCB using fastening members.

4. The shielding and heat dissipation device according to claim 1, wherein the conductive bracket (1) is made up of an elastic sheetmetal or conductive foam.

5. The shielding and heat dissipation device according to claim 1, wherein the conductive bracket (1) is made up of an elastic sheetmetal integrally formed with the shielding case (9).

6. The shielding and heat dissipation device according to claim 1, wherein metal bosses are provided on the bottom of the heat sink.

7. The shielding and heat dissipation device according to claim 1, wherein a heat transfer layer is provided between the heat sink (2) and the heat-generating electronic component (3).

8. The shielding and heat dissipation device according to claim 7, wherein the heat transfer layer is a thermal conductive pad and/or thermal conductive glue.

\* \* \* \* \*